United States Patent
Chan et al.

(10) Patent No.: US 10,552,571 B2
(45) Date of Patent: *Feb. 4, 2020

(54) SYSTEMS AND METHODS FOR SURFACE COVERING PREPARATION

(71) Applicant: Elwha LLC, Bellevue, WA (US)

(72) Inventors: Alistair K. Chan, Bainbridge Island, WA (US); Roderick A. Hyde, Redmond, WA (US)

(73) Assignee: ELWHA LLC, Bellevue, WA (US)

( * ) Notice: Subject to any disclaimer, the term of this patent is extended or adjusted under 35 U.S.C. 154(b) by 532 days.

This patent is subject to a terminal disclaimer.

(21) Appl. No.: 14/517,355

(22) Filed: Oct. 17, 2014

(65) Prior Publication Data

US 2015/0269746 A1 Sep. 24, 2015

Related U.S. Application Data

(63) Continuation-in-part of application No. 14/222,346, filed on Mar. 21, 2014, now Pat. No. 9,317,950.

(51) Int. Cl.
*G06F 17/50* (2006.01)

(52) U.S. Cl.
CPC ..... *G06F 17/5086* (2013.01); *Y10T 29/49826* (2015.01)

(58) Field of Classification Search
CPC ... G06F 17/5086; G06F 17/5004; B26D 5/00; Y10T 29/49826; B26F 1/3813
USPC .......................................................... 703/1
See application file for complete search history.

(56) References Cited

U.S. PATENT DOCUMENTS

| 3,172,417 A | 3/1965 | Zulkowitz et al. |
| 4,428,056 A | 1/1984 | Schroeder et al. |
| 5,086,477 A * | 2/1992 | Yu ........................ G06F 17/5068 348/87 |
| 6,119,565 A | 9/2000 | L'Heureux |
| 6,226,004 B1 * | 5/2001 | Nishihara ............... G06T 11/40 345/420 |
| 6,312,124 B1 | 11/2001 | Desormeaux |
| 6,681,140 B1 * | 1/2004 | Heil ........................ B27F 1/02 700/160 |
| 2004/0030733 A1 | 2/2004 | Bell |
| 2004/0175042 A1 * | 9/2004 | Kroeker ................... G06K 9/20 382/192 |

(Continued)

FOREIGN PATENT DOCUMENTS

WO    WO 2013033356 A1 *  3/2013  ............. G06Q 30/06

OTHER PUBLICATIONS

Simen Edsjo Kalnaes, Bjorn Petter Jelle, Vacuum insulation panel products: A state-of-the-art review and future research pathways, Dec. 22, 2013, Elsevier Ltd., Applied Energy 116 (2014) 355-375.*

(Continued)

*Primary Examiner* — Rehana Perveen
*Assistant Examiner* — Justin C Mikowski
(74) *Attorney, Agent, or Firm* — Foley & Lardner LLP

(57) ABSTRACT

A surface covering layout system includes a processing circuit configured to receive image data regarding one or more images associated with a surface to be covered with a surface covering, and generate a surface covering layout based on the image data, the surface covering layout providing an indication of a pattern of a plurality of covering members included in the surface covering.

9 Claims, 9 Drawing Sheets

(56) References Cited

U.S. PATENT DOCUMENTS

| | | | |
|---|---|---|---|
| 2007/0191981 A1* | 8/2007 | Huang | B23K 26/0093 700/166 |
| 2007/0201740 A1 | 8/2007 | Kuwata | |
| 2008/0065252 A1* | 3/2008 | Hashimoto | G05B 19/4097 700/107 |
| 2009/0100769 A1* | 4/2009 | Barrett | A47K 4/00 52/35 |
| 2010/0030872 A1 | 2/2010 | Caleca et al. | |
| 2010/0185309 A1* | 7/2010 | Ohiaeri | G06Q 30/0621 700/98 |
| 2011/0126416 A1 | 6/2011 | Swanson et al. | |
| 2013/0004076 A1* | 1/2013 | Koo | G06K 9/228 382/176 |
| 2014/0320661 A1 | 10/2014 | Sankar et al. | |

OTHER PUBLICATIONS

Roland Caps et al., Quality control of vacuum insulation panels: Methods of measuring gas pressure, 2007, Elsevier Ltd., Vacuum 82 (2008) 691-699.*

Diana Santos et. al., "On the expeditious modelling of buildings", 2010 Second International Conference on Games and Virtual Worlds for Serious Applications, (2010) 60-67 (Year: 2010).*

"Ordeer"; Dictionary.com; downloaded on Dec. 6, 2016; printed on Dec. 6, 2016; 1 page; located at: http://www.dictionary.com/browse/order?s=t.

PCT International Search Report; International App. No. PCT/US2015/021427; dated Jun. 9, 2015; pp. 1-6.

Itrend—A Very Cool Ipad App from Trend USA—Makers fo Very Cool Tiles, from Modenus.com (http://www.modenus.com/blog/interiordesignproducts/surfacematerials/itend-a-very-cool-ipad-app-from-trend-makers-of-very-cool-tiles), retrieved on Apr. 7, 2014, 3 pages.

Kevothermal, The Technology, Production Information Page Retrieved from http://www.kevothermal.com/the_technology.html on May 12, 2014, 1 page.

Optim-R, Next Generation Insulation Solutions, Product Description Page Feb. 2014, 1 page.

Thermocor CIP Technology, Production Information Page Retrieved from http://www.thermocorvip.com/vacuum-insulation-panels/ on May 12, 2014, 1 page.

European Patent Office, Supplementary European Search Report, Pursuant to Rule 62 EPC; App. No. EP 15764963; dated Aug. 2, 2017 (received by our Agent on Aug. 15, 2017); pp. 1-10.

* cited by examiner

SYSTEMS AND METHODS FOR SURFACE COVERING PREPARATION

CROSS-REFERENCE TO RELATED PATENT APPLICATIONS

This application is a continuation-in-part of application Ser. No. 14/222,346, filed Mar. 21, 2014, which is incorporated herein by reference in its entirety.

BACKGROUND

A surface covering (e.g., tiling, wood flooring) may be composed of individual surface covering members (e.g., individual tiles, wood planks), and used to cover a surface (e.g., a floor, wall, ceiling, roof, etc.). Typically, at least some of the covering members are uniform in size and shape, and the covering members are arranged in a pattern (e.g., a basket weave pattern, a subway pattern) to provide an aesthetically pleasing appearance. Certain areas to which the surface covering is to be applied may include one or more obstructions (e.g., holes in a floor, windows in a wall, partitions, irregular room shapes, etc.). In order to apply a surface covering to the surface, the covering members can be trimmed and arranged in a number of ways to properly cover the surface and fit around any obstacles.

SUMMARY

One embodiment relates to a surface covering layout system, including a processing circuit configured to receive image data regarding one or more images associated with a surface to be covered with a surface covering, and generate a surface covering layout based on the image data, the surface covering layout providing an indication of a pattern of a plurality of covering members included in the surface covering.

Another embodiment relates to a surface covering layout system, including a data acquisition system configured to acquire an image associated with a surface to be covered with a surface covering; a layout device configured to receive image data including the image and generate layout data based on the image data, the layout data providing an indication of a pattern of a plurality of covering members included in the surface covering; and a tool system configured to receive the layout data and provide an indication of a cut line based on the layout data.

Another embodiment relates to a method of providing layout data for a surface covering, including receiving image data regarding one or more images associated with a surface to be covered with a surface covering; generating layout data based on the image data, the layout data providing an indication of a pattern of a plurality of covering members included in the surface covering; and transmitting the layout data to a tool system.

Another embodiment relates to a method of determining a layout for a surface covering, including acquiring, with a camera, an image associated with a surface to be covered with a surface covering; receiving, with a layout device, image data including the image; determining, with the layout device, layout data based on the image data, the layout data providing an indication of a pattern of a plurality of covering members included in the surface covering; receiving, with a tool system, the layout data; and providing, by the tool system, an indication of a cut line on an individual one of the covering members based on the layout data.

Another embodiment relates to a layout system, including a processing circuit configured to receive image data regarding one or more images associated with an area to receive a plurality of insulation members; and generate a layout based on the image data, the layout providing an indication of a pattern of the plurality of insulation members.

Another embodiment relates to a method of providing layout data for insulation members, including receiving image data regarding one or more images associated with an area to receive the insulation members; generating layout data based on the image data, the layout data providing an indication of a pattern of the insulation members; and transmitting the layout data to a tool system.

Another embodiment relates to a surface covering layout system, including a data acquisition system configured to acquire an image associated with a surface to be covered with a surface covering; a layout device configured to receive image data including the image and generate layout data based on the image data, the layout data providing an indication of a pattern of a plurality of covering members included in the surface covering; and a tool system configured to receive the layout data and provide an indication of a cut line based on the layout data.

Another embodiment relates to a method of modifying a vacuum-insulated panel, including determining a cut area to be removed from a vacuum-insulated panel using a computer-implemented layout system; removing the cut area from the panel along a cut line; sealing the vacuum-insulated panel along the cut line; depressurizing an interior of the vacuum-insulated panel; and installing the panel into a desired position.

Another embodiment relates to a method of evaluating vacuum-insulated panels, including inserting a conduit into an interior of a vacuum-insulated panel; measuring a pressure of the interior using a pressure sensor module coupled to the conduit; depressurizing the interior based on the measured pressure; and removing the conduit from the interior of the panel.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
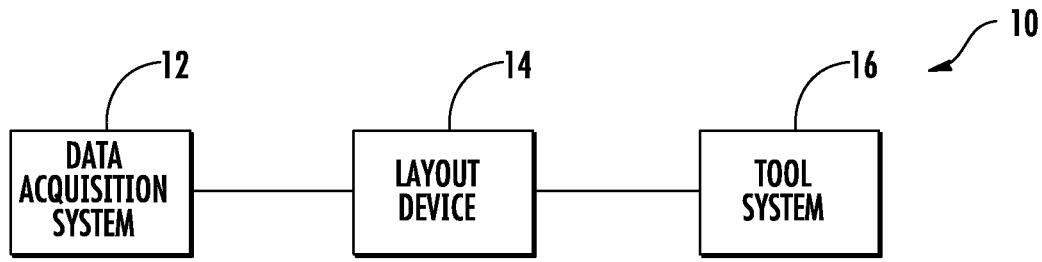
FIG. 1 is a schematic representation of a surface covering layout system according to one embodiment.

In the following detailed description, reference is made to the accompanying drawings, which form a part thereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring to the figures generally, various embodiments disclosed herein relate to surface coverings, and more specifically, to facilitating the layout and preparation of a surface covering to be applied to a surface including various obstructions, irregular boundaries, etc. It should be understood that while various embodiments discussed herein are illustrated with respect to "surface coverings," "surface covering members" and similar terms, the teachings herein may extend to items that do not necessarily cover a surface, but rather, for example, form a self-supporting structure, etc., where it is desirable to utilize a particular layout due to aesthetics, materials costs, installation considerations, and the like. All such applications are to be understood to be within the scope of the present disclosure.

Generally, a surface covering such as tile is applied to a surface such as a floor to provide a desired appearance, durability, and/or function for a particular space (e.g., a bathroom, a kitchen, etc.). In the case of a tile covering, some or all of the tiles may be uniformly sized and shaped, and the tiles may be arranged in a pattern on a floor or other surface (e.g., a wall, ceiling, etc.) to cover a certain area. However, the area to be covered may be irregular in shape due to various obstructions (fixtures, holes, windows, walls, etc.), such that certain tiles may need to be cut to enable the tile surface to properly cover the floor. Certain layouts, or configurations, of the tile may be advantageous or desirable (e.g., in terms of minimizing material waste or simplifying necessary tile cutting, aligning a tile pattern with one or more boundaries, or matching a tile pattern with a pattern of preexisting, neighboring tiles). As such, various embodiments disclosed herein relate to capturing image data (e.g., still images, etc.) regarding an existing space (including a surface to which a surface covering is to be applied), and based on the image data, providing layout information (e.g., layout data) regarding a proposed layout for a surface covering (e.g., a graphical depiction of an applied surface covering, materials requirements, installation instructions, etc.), providing cutting information for and/or cutting covering members based on a particular layout, and the like. In some embodiments, various tasks are all performed on-site (e.g., at a location where a surface covering is to be applied). In other embodiments, one or more tasks (e.g., printing cut patterns, cutting covering members, etc.) are performed remotely relative to other tasks (e.g., capturing still images of an installation site).

Referring now to FIG. 1, surface covering layout system 10 is shown according to one embodiment. Layout system 10 includes data acquisition system 12, layout device 14, and tool system 16. Layout system 10 is configured to facilitate the preparation and installation of a surface covering such as tile, wood flooring, roof shingles, ceiling panels, and the like. Layout system 10 is usable in a wide range of establishments, including homes, public facilities, etc. In some embodiments, data acquisition system 12 acquires data (e.g., image data) regarding an area where a surface covering is to be installed or applied, and provides the data to layout device 14. Based on the data, layout device 14 can provide various types of layout data or information regarding the surface covering, including a proposed layout pattern or a proposed cutting pattern. Layout device 14 can further provide layout data to tool system 16 such that tool system 16 can print cut lines on individual covering members, cut individual covering members, print out cutting templates, and the like. In some embodiments, one or more of data acquisition system 12, layout device 14, and tool system 16 can be combined into integrated components (e.g., an integrated data acquisition and layout device, an integrated layout and tool system, etc.). Furthermore, data acquisition system 12, layout device 14, and tool system 16 can be located locally or remotely relative to each other.

Figure 2:
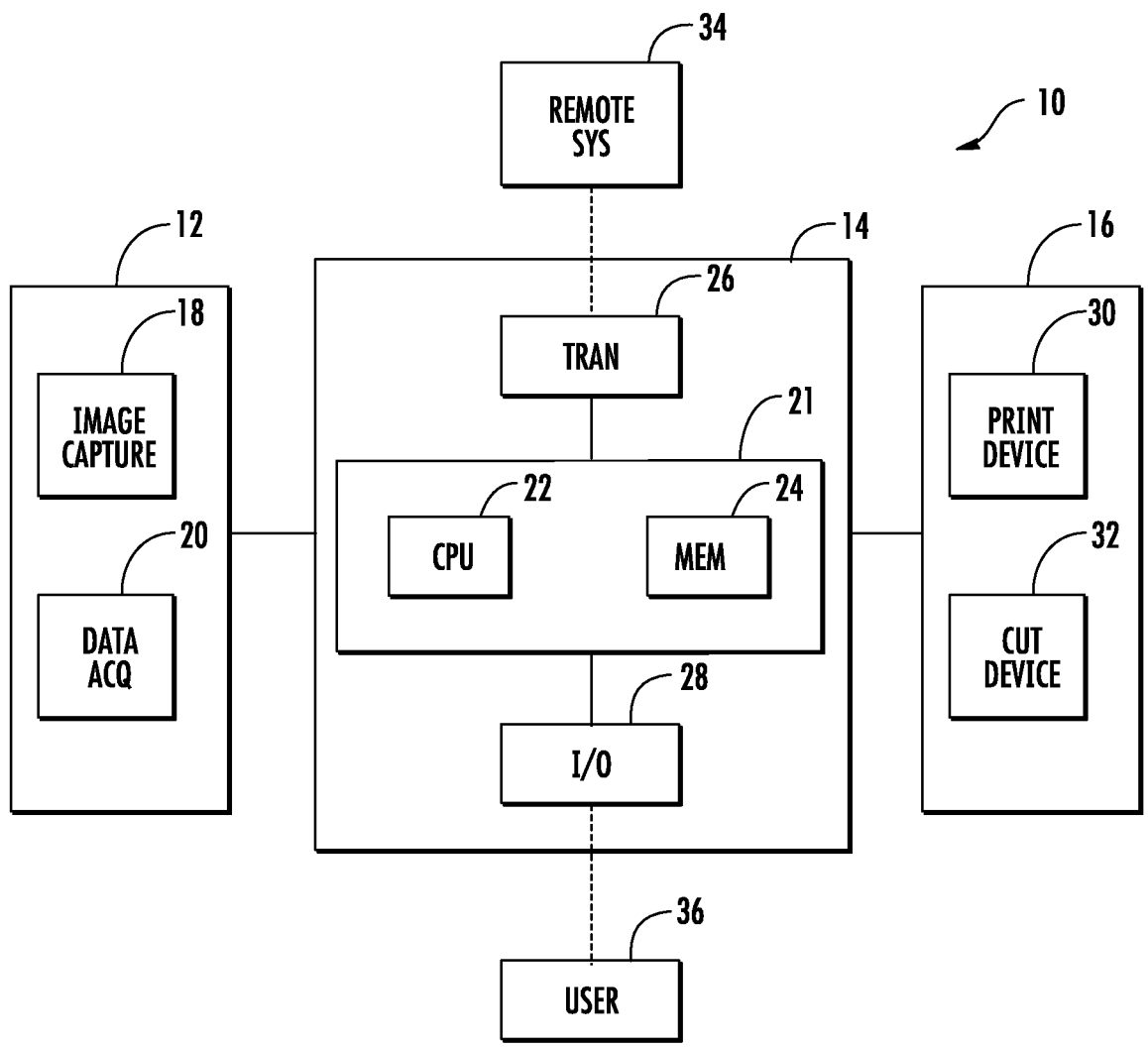
FIG. 2 is a schematic representation of surface covering layout system of FIG. 1 shown in greater detail according to one embodiment.

Referring now to FIG. 2, layout system 10 is shown in greater detail according to one embodiment. Data acquisition system 12 includes image capture device 18. Image capture device 18 is in one embodiment a camera (e.g., a digital camera) suitable for obtaining still images or other data (e.g., image data) of an area to which a surface covering is to be applied. Data acquisition system 12 can further include other data acquisition devices such as data acquisition device 20, which may include any of a variety of sensors, measuring devices, or other devices capable of acquiring image or other data regarding an area. Data acquisition system 12 provides acquired image data to layout device 14.

Layout device 14 includes processing circuit 21, transceiver 26, and input/output device 28. Processing circuit 21 receives the data (e.g., image data) from data acquisition system 12, and provides various types of layout data to a user (e.g., user 36), to a remote system (e.g., see remote system 34), and/or tool system 16. Processing circuit 21 can also receive inputs from any or all of user 36, remote system 34, and tool system 16. In one embodiment, remote system 34 can be a vendor (e.g., a packaging system, etc.) who assembles and provides surface covering materials based on layout data received from layout device 14. In one embodiment, remote system 34 can be operated by a vendor who operates layout device 14 and provides surface covering materials based on image data received from data acquisition system 12. For example, the vendor can provide a required number of covering members, precut covering members, cutting templates, and the like based on the layout data.

Processing circuit 21 includes processor 22 and memory 24. Processor 22 may be implemented as a general-purpose processor, an application specific integrated circuit (ASIC), one or more field programmable gate arrays (FPGAs), a digital-signal-processor (DSP), a group of processing components, or other suitable electronic processing components. Memory 24 is one or more devices (e.g., RAM, ROM, Flash Memory, hard disk storage, etc.) for storing data and/or computer code for facilitating the various processes described herein. Memory 24 may be or include non-transient volatile memory or non-volatile memory. Memory 24 may include database components, object code components, script components, or any other type of information structure for supporting the various activities and information structures described herein. Memory 24 may be communicably connected to processor 22 and provide computer code or instructions to processor 22 for executing the processes described herein.

Referring further to FIG. 2, tool system 16 includes printing device 30 and cutting device 32. In some embodiments, tool system 16 includes both printing device 30 and cutting device 32. In other embodiments, tool system 16 includes only one of printing device 30 and cutting device 32. In yet further embodiments, printing device 30 and cutting device 32 are combined into a single integrated printing and cutting device. Other devices can further be included as part of tool system 16 according to various alternative embodiments. Printing device 30 can be configured to print a cut line onto individual covering members. Alternatively, printing device 30 can be configured to provide cutting templates (e.g., paper templates) that are sized and shaped the same as covering members, and include cut lines such that the cutting template can be used to make an appropriate cut on a covering member.

Figure 3:
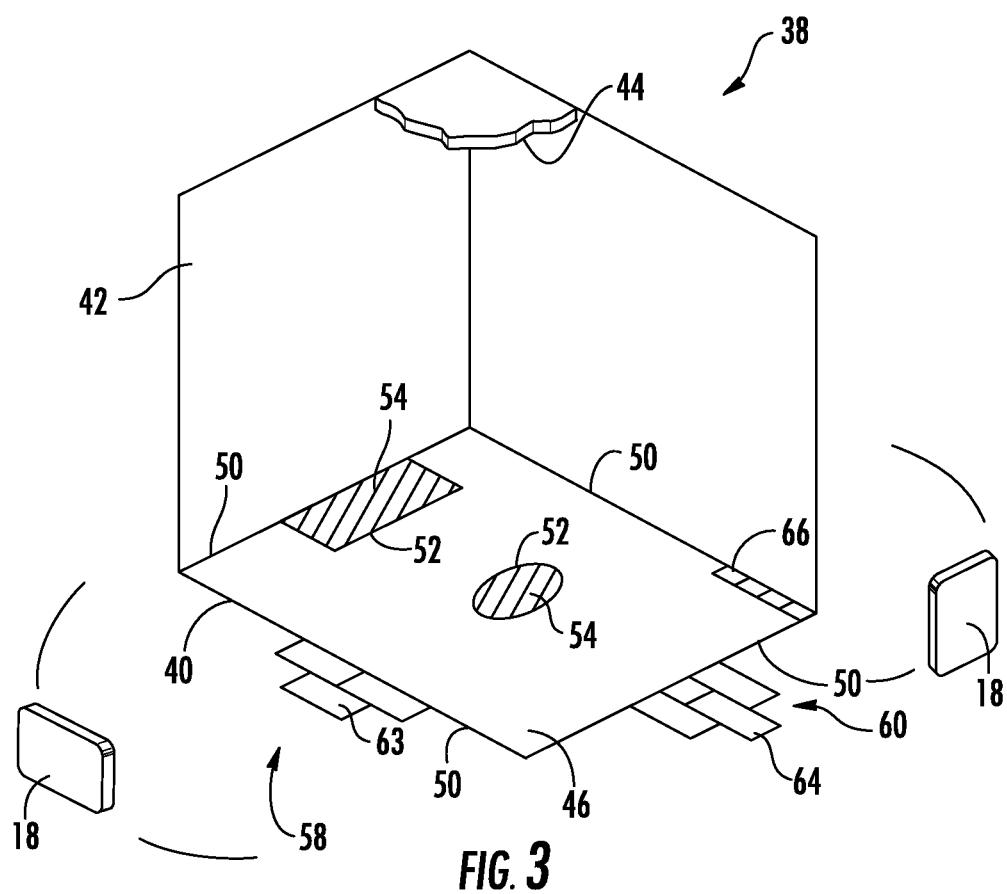
FIG. 3 is a perspective view of an area to which a surface covering is to be applied according to one embodiment.

Referring now to FIG. 3, in one embodiment, image capture device 18 is configured to capture one or more images regarding an area to be covered by a surface covering. For example, FIG. 3 shows image capture device 18 positioned at two different positions relative to space 38. Space 38 can include one or more surfaces such as floor 40, walls 42, and a ceiling 44. In one embodiment, floor 40 defines surface 46 to which a surface covering is to be applied. Surface 46 is defined by boundaries 50, 52. Boundary 50 is an external boundary, such that the surface covering is provided to the interior of boundary 50. Boundary 52 is an internal boundary, such that the surface covering is provided to the exterior of boundary 52. As such, surface 46 extends between internal boundary 50 and external boundary 52. One or both of boundaries 50, 52 can be formed at least in part by obstructions such as obstructions 54. It should be noted that in some embodiments, there may be no internal boundary, such that surface 46 is defined only by external boundary 52.

Space 38 can further include one or more existing surface coverings. For example, as shown in FIG. 3, space 38 includes existing surface covering 58 made up of covering members 62, and existing surface covering 60 made up of covering members 64. In various alternative embodiments, covering members 62, 64 can be the same or different in shape, size, color, etc. relative to each other, or relative to a covering member used to cover surface 46. Furthermore, a pattern of surface covering 58 and the pattern of surface covering 60 can be the same or different in pattern type, orientation, alignment, etc. relative to each other, or relative to a pattern of a surface covering used to cover surface 46.

Figure 4:
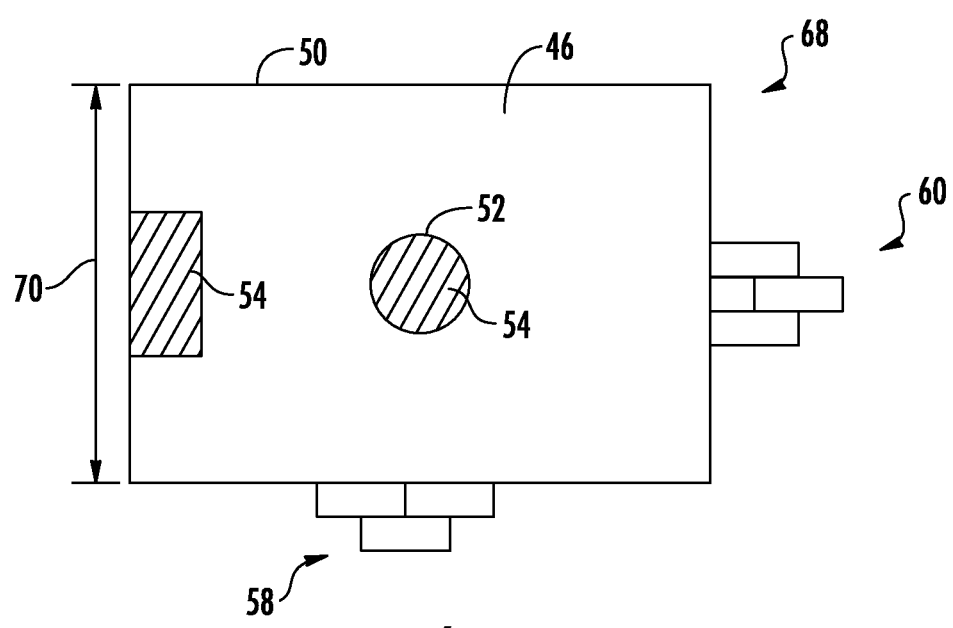
FIG. 4 is a schematic representation of a surface to which a surface covering is to be applied according to one embodiment.

Upon capturing one or more still images or other image data regarding space 38, image capture device 18 provides the image data to layout device 14. Referring to FIG. 4, in one embodiment, layout device 14 is configured to generate a two-dimensional representation 68 (e.g., a two dimensional layout image or drawing) including surface 46 and one or more surrounding areas. Representation 68 shows surface 46 bounded by boundaries 50, 52, along with obstructions 54 which may form all or part of one or both of boundaries 50, 52. Representation 68 further shows existing surface coverings 58, 60.

In some embodiments, processing circuit 21 is configured to use one or more corner or boundary detection algorithms to identify boundaries 50, 52 or other features based on still images provided by image capture device 18. In other embodiments, other methods may be used, including ridge detection methods and the like. In one embodiment, reference marker 66 (see FIG. 3) can be placed in the field of view of image capture device 18 such that based on the sizes of various features captured in the images relative to reference marker 66, a known scale can be applied to the still images in generating representation 68 (e.g., such that the dimensions of various boundaries, etc. of representation 68 are known). In another embodiment, image capture device 18 may itself generate image dimensional data, providing this data, for example, as metadata associated with the image. In one example of this embodiment, image capture device 18 may acquire range information (e.g., via an ultrasonic range sensor, a depth-of-focus range sensor, or the like) and combine this with angular field of view data from the image settings, to determine image dimension data. In another example of this embodiment, image capture device 18 may acquire range information stereoscopically, e.g., via use of a stereoscopic camera, or by taking two images and using an internal inertial reference system (e.g., accelerometer-based) to determine the separation between the vantage points and orientations of the two images, hence determining image dimensional data. In other embodiments, once representation 68 is generated, processing circuit 21 can prompt a user to input (e.g., via input/output device 28) a known dimension, such as dimension 70 shown in FIG. 4. Based on the known dimension, processing circuit 21 can determine the dimensions of other features of representation 68 accordingly. In one embodiment, layout device 14 can provide representation 68 to user 36 and/or remote system 34 (e.g., a vendor, etc.) in the form of a two dimensional layout or display.

Figure 5:
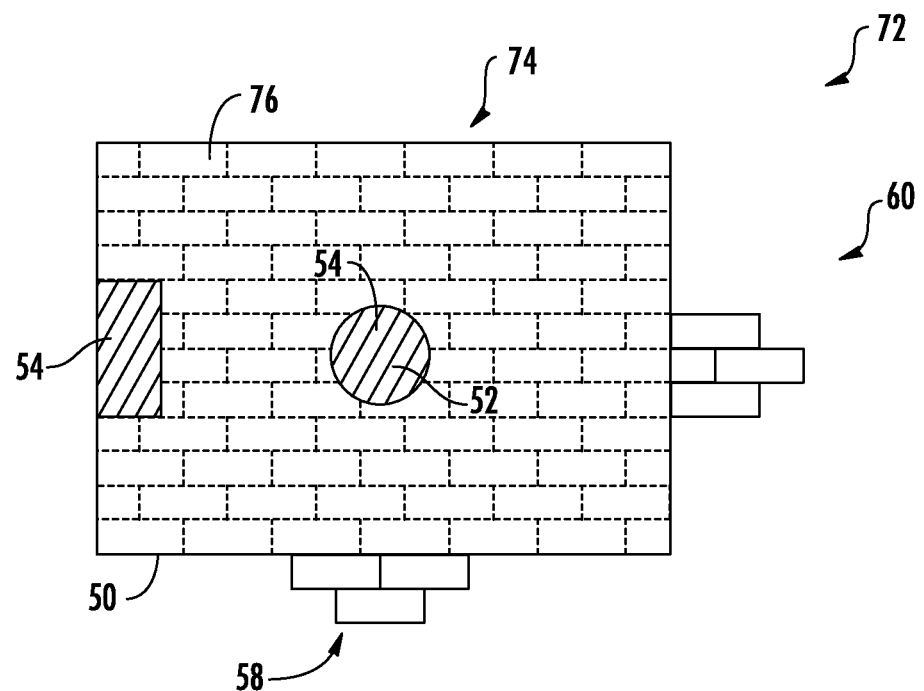
FIG. 5 is a schematic representation of a surface with a surface covering according to one embodiment.

Referring now to FIG. 5, layout device 14 is in one embodiment further configured to provide proposed layout 72 (e.g., a graphical representation) showing surface covering 74 covering surface 46. Layout 72 provides an indication of a pattern for covering members 76 that form surface covering 74. The pattern indicates the location of each covering member, and provides a further indication of whether a covering member will need to be cut prior to installation. Layout device 14 may base its pattern upon covering members with predetermined initial sizes and shapes, or layout device 14 may itself determine which size and shape of covering members to best use in its pattern (e.g., selecting a size which will result in less wastage or number of cuts than an alternative size). The pattern for covering member 76 can be determined by layout device 14 based on a variety of factors, including minimizing a number of covering members used, minimizing material waste due to cutting, trimming, etc., minimizing the number of cuts made to the covering members, minimizing or maximizing the types of certain cuts (e.g., round, straight, irregular, etc.) made to the covering members, and the like.

The pattern for covering member can further be determined based on one or more existing surface coverings, such as existing surface coverings 58, 60. For example, a pattern type, pattern position (e.g., in an X-Y plane along the surface to be covered), or pattern orientation (e.g., rotational orientation) can be selected based on patterns of existing surface coverings. The pattern for covering member 74 can be configured to match the pattern for one or more of existing surface coverings 58, 60, or alternatively, can be configured to be mismatched by a certain amount (e.g., a linear or rotational offset between patterns, etc.). In some embodiments, a user can provide inputs to vary the relative positions of the surface covering and the area to be covered (e.g., target a visual representation of how different configurations will appear).

Figure 6:
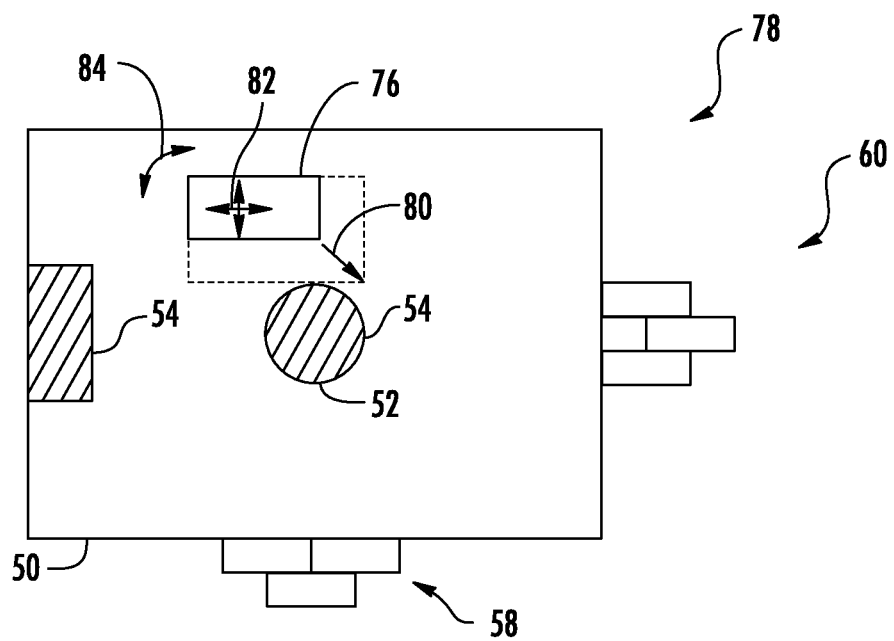
FIG. 6 is a schematic representation of a covering member that can be configured by a user according to one embodiment.

Referring to FIG. 6, in some embodiments, a user can be provided with a planning interface 78 configured to enable a user to provide various inputs regarding the pattern of surface covering 74. Interface 78 can provide a depiction of a single covering member 76 (or, alternatively, multiple covering members) on surface 46. A user can provide inputs (e.g., via user input/output device 28) to change one or more of a size of the covering member (e.g., by adjusting the size of covering member 76 along line 80), a location of covering member 76 (e.g., by moving covering member in the direction of arrows 82), or a rotational orientation of covering member 76 (e.g., by rotating covering member 76 in the direction of arrow 84). In some embodiments, user input/output device 28 can include a display screen configured to provide a display of interface 78. In one embodiment, the display can be a touchscreen display such that the user can provide various inputs via the touch screen. In other embodiments, other input/output devices can be used (e.g., other types of displays, a keyboard, mouse, etc.).

Based on any of the above factors and inputs, layout device 14 can determine layout data for surface 46, including a pattern for surface covering 74, a cutting pattern (e.g., cut lines for individual covering members), a cost (e.g., a bill of materials), an installation sequence for the covering members, and the like. Once a pattern for surface covering 74 is finalized, all or portions of the layout data can be provided to the user (e.g., via an image file, via a display provided with input/output device 28), transmitted to a remote system such as remote system 34, or transmitted to tool system 16 (e.g., printing device 30 and/or cutting device 32).

Figure 7:
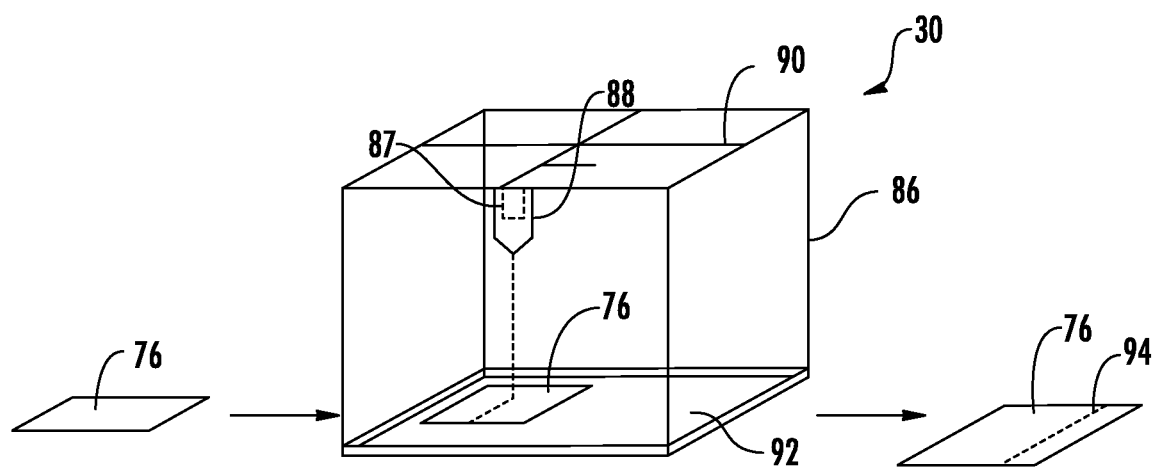
FIG. 7 is a schematic representation of a printing device according to one embodiment.

Referring to FIG. 7, printing device 30 is shown according to one embodiment. Printing device 30 includes housing 86, printing controller 87, printing mechanism 88, carriage 90, and support 92. Printing controller 87 is configured to receive data regarding a surface covering (e.g., layout data from layout device 14), and control operation of printing mechanism 88 to provide a printed image on an object such as a covering member, a cutting template, etc. Carriage 90 provides movement capabilities for printing mechanism 88 (e.g., in an X-Y plane). Support 92 supports an object (e.g., a surface covering or cutting template) receiving the printed image.

In one embodiment, printing controller 87 receives layout data from layout device 14. Based on the layout data, printing controller 87 controls the operation of printing mechanism 88 such that a cut line is printed onto covering member 76. Printing mechanism 88 can be any suitable printing mechanism, including a laser printer, ink-jet printer, etc. While in FIG. 7 printing mechanism 88 is shown coupled to carriage 90, in other embodiments, printing mechanism 88 can be a handheld printer, such that printing mechanism 88 can be held in a desired position relative to covering member 76 to provide an appropriate cut line 94. Alternatively, rather than printing a cut line, printing mechanism 88 can optically project a cut line for covering member 76.

Figure 8:
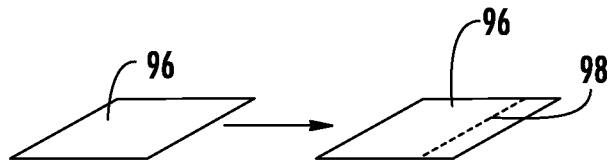
FIG. 8 is a perspective view of a template usable to layout tiles according to one embodiment.

Referring to FIG. 8, is some embodiments, printing device 30 can be configured to provide a cutting template such as template 96. Template 96 is in one embodiment shaped and sized to match covering member 76. Template 96 includes cut line 98 that indicates where a cut is to be made for the covering member corresponding to the particular template. As such, a user can place template 96 over covering member 76 and cut along cut ling 98 to obtain an appropriately cut covering member. In one embodiment, printing device 30 receives blank template 96 and provides cut line 98 on template 96 based on layout data received from layout device 14.

Figure 9:
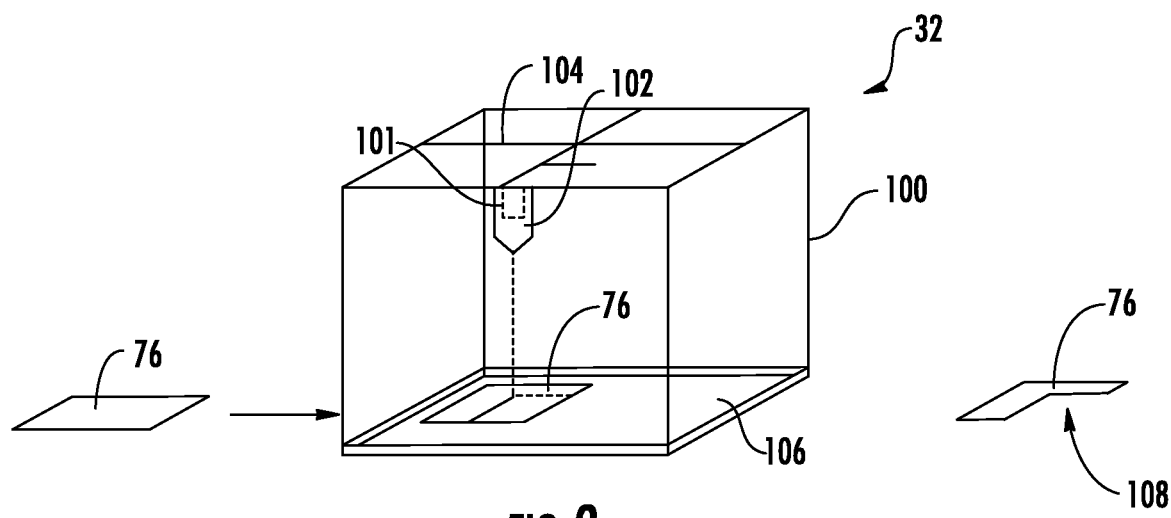
FIG. 9 is schematic representation of a cutting device according to one embodiment.

Referring to FIG. 9, cutting device 32 is shown according to one embodiment. Cutting device 32 includes housing 100, cutting controller 101, cutting mechanism 102, carriage 104, and support 106. Cutting controller 101 is configured to receive data (e.g., layout data from layout device 14), regarding a surface covering and control operation of cutting mechanism 102 to cut (e.g., trim, etc.) cutout 108 into covering member 76. Carriage 104 provides movement capabilities for cutting mechanism 102 (e.g., in an X-Y plane). Support 106 supports covering member 76 during the cutting process.

In one embodiment, cutting controller 101 receives layout data from layout device 14. Based on the layout data, cutting controller 101 controls the operation of cutting mechanism 102 such that covering member 76 is cut to a desired shape. Cutting mechanism 102 can be any suitable cutting mechanism, including a laser cutter, moving blade (e.g., a rotating or reciprocating blade), grinder, etc.

Printing device 30 and/or cutting device 32 can print on or cut all of the necessary covering members or templates required to cover surface 46. As such, should tool system 16 be located remotely from an installation site for surface 46, a complete package of ready-to-install, or ready-to-cut (by way of a provided cut line, a printed cutting template, an image file displaying cutting lines, etc.) covering members can be provided to the installation site to minimize the on-site time and labor that may otherwise be required to install the various covering members onto a desired surface. This package can be accompanied (directly, or indirectly via link to a data file) by installation instructions, e.g., a labeled diagram of the layout, an emplacement sequence, etc. The individual covering members may themselves be labeled (e.g., on their backs, or by removable stickers) to indicate their location within the layout, their orientation, their neighboring covering members, their emplacement sequence, or the like.

It should be noted layout system 10 is usable in a wide variety of applications. As shown in FIG. 3, layout system may be usable in connection with a floor, wall, or ceiling of a room or other space to provide a layout pattern and/or prepare covering members such as tiles, wood planks, wallpaper, carpet, etc. for cutting/installation. In other embodiments, layout system 10 can be used in connection with different applications and with different covering members.

Figure 10:
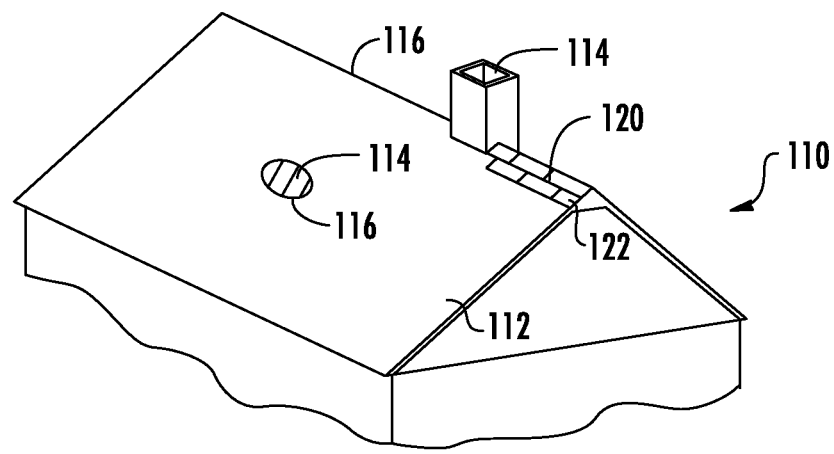
FIG. 10 is a perspective view of a roof to which a surface covering is to be applied according to one embodiment.

For example, referring to FIG. 10, house 110 is shown having a roof structure that includes underlayment 112 in one embodiment. Layout system 10 can be used to determine an appropriate pattern for surface covering 120 (e.g., a tile or shingle roof) made up of individual covering members 122 (e.g., roof tiles or shingles). As shown in FIG. 10, the roof structure, including obstacles 114, define boundaries 116 for surface covering 120. In some embodiments, layout system 10 can be used to install an entire roof. In other embodiments, layout system 10 can be used to install (or replace) only a portion of the roof, such that the new surface covering is installed to match the pattern of the exiting roof tiles or shingles. Similarly, layout system 10 may be used for laying out siding planks or siding shingles (cedar shakes, etc.).

Figure 11:
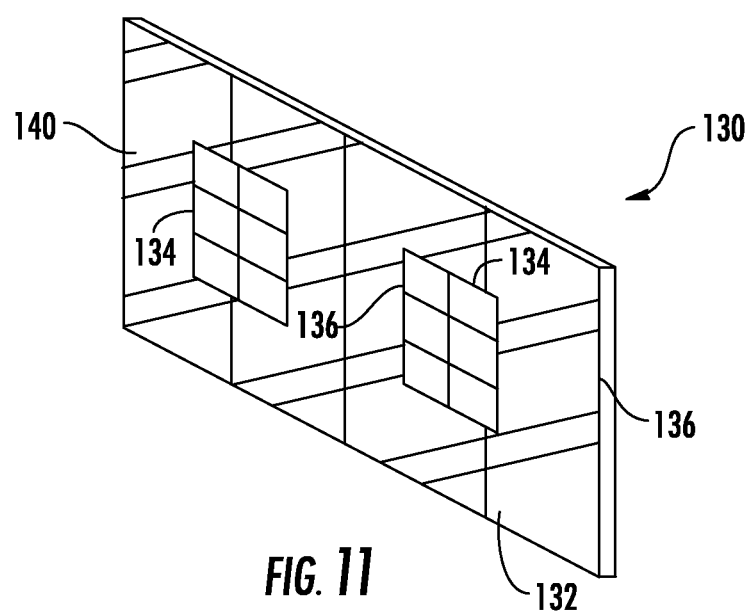
FIG. 11 is a perspective view of a wall to which a surface covering is applied according to one embodiment.

Referring to FIG. 11, wall 130 is shown with surface covering 140 provided in the form of multiple segments or portions 132 of wallpaper. Layout system 10 can be used to determine an appropriate pattern for surface covering 140 and the individual portions 132 of wallpaper (e.g., to provide a continuous pattern along wall 130 between adjacent portions 132, and between portions 132 and existing surface coverings). As shown in FIG. 11, boundaries 136, formed in part by obstacles 134 (e.g., windows), define the area to be covered by surface covering 140.

Figure 12:
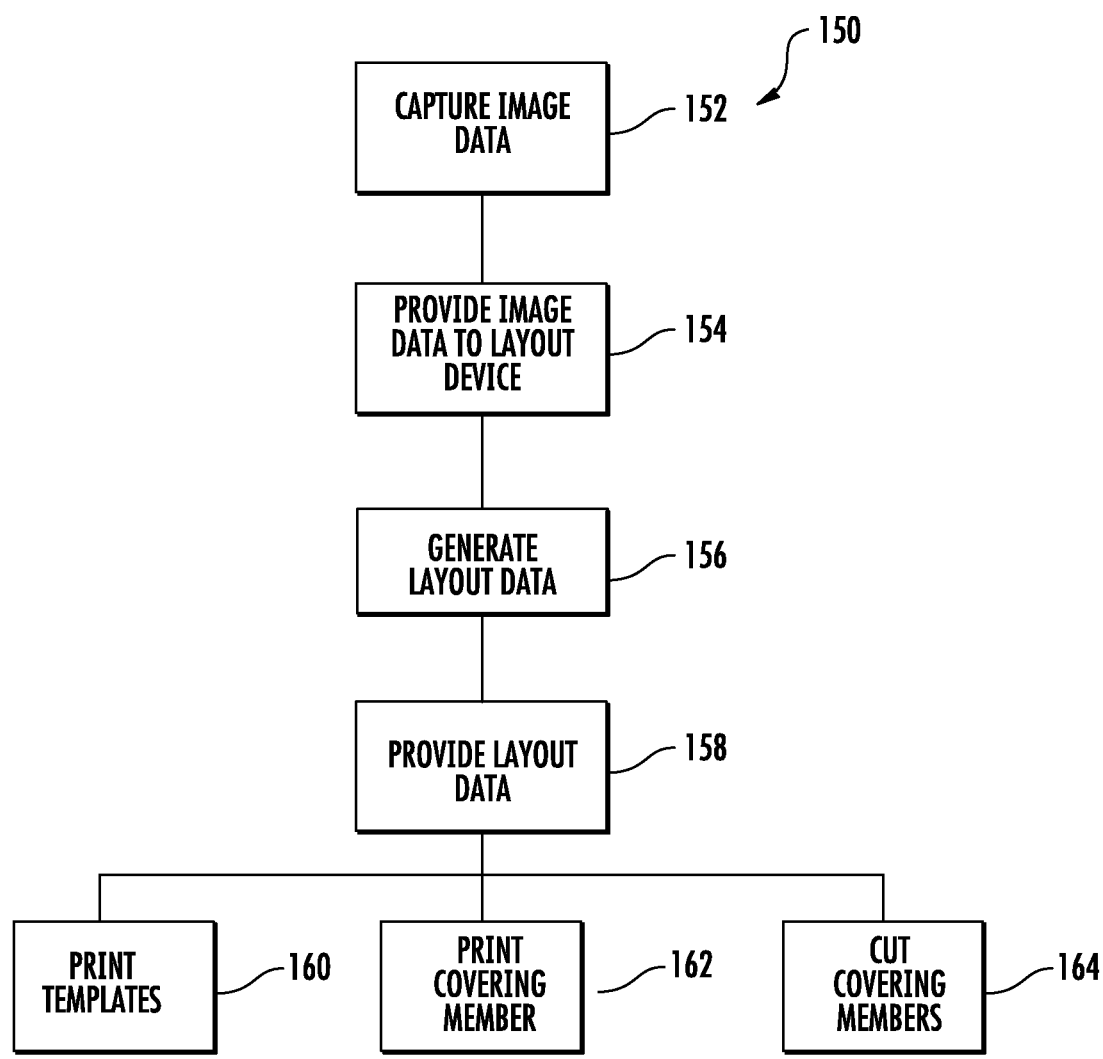
FIG. 12 is a block diagram illustrating a method of laying out a surface covering according to one embodiment.

Referring to FIG. 12, method 150 of providing layout data and preparing a surface covering for installation is shown according to one embodiment. Image data is captured (152). The image data can be acquired by using an image capture device, such as a camera, sensor, or other suitable device. The image data is then provided to a layout or similar device (154) and layout data is generated (156). In one embodiment, the layout device is integrated with the image capture device. In other embodiments, the layout device is separate and/or remote from the image capture device. Various methods, including any of those disclosed herein, can be used to generate the layout data. The layout data is provided to other devices, users, or third parties (158). For example, the layout data can be sent to a vendor for preparation of the surface covering materials. Alternatively, the layout data can be displayed to a user via a display or similar device.

In some embodiments, the layout data can be provided to a tooling system, such that the tooling system can print templates (160), print cut lines or other information onto covering members (162), and/or cut covering members (164). A variety of printing and/or cutting devices can be used to print templates, cut covering members, etc. Furthermore, in an alternative embodiment, the tooling system can be configured to display a cut line (e.g., by way of a laser or other light source) on a covering member to act as a cutting guide. As noted above, various steps in the process can be performed either locally (e.g., on-site, or local relative to each other), or remotely (e.g., off-site, or remote relative to each other).

In one example embodiment, a user may wish to cover a floor with tiles. The user can use a digital camera to take a number of different digital photographs of the floor area (e.g., from different perspectives), including any obstructions such as cabinetry, toilet drains, etc. The user can then provide the digital photographs (e.g., in the form of JPEG files or other file formats) to a layout system. The layout system can be provided by way of a personal computer of the user (e.g., a web-based application, etc.), or by way of a vendor computer (e.g., a computer provided by a tile shop or other vendor). Based on the digital photographs, a layout of a desired tile can be generated based on a number of factors, including a user-customized tile pattern, matching of an existing tile pattern, minimization of materials, and the like. Based on the generated layout, the vendor can provide cutting templates or premarked and/or precut tiles for installation. The tiles can be marked with an installation order, and in some embodiments, can be put into an order based on a preferred order of installation of the tiles. Similar steps can be followed for other types of surface coverings.

According to various alternative embodiments, the covering members may be or include thermal insulation members, such as vacuum-insulated panels. In some embodiments, the vacuum-insulated panels may provide sound insulation. For example, referring to FIGS. 13-14, a covering member is shown as vacuum-insulated panel 212 according to one embodiment. Panel 212 includes outer cover or film 222 that defines interior 224, within which is provided insulator 220. Panel 212 may include other components according to various other embodiments. Film 222 provides a fluid-tight (e.g., liquid and gas impermeable) envelope around insulator 220, and may be a plastic or metal material. A vacuum is drawn within interior 224 to provide for a low pressure interior that provides enhanced thermal or sound insulating efficiency relative to other types of more conventional insulation. Insulator 220 may be any suitable insulation material, including open-cell foams or other materials.

In one embodiment, panel 212 is configured for use as an insulating member in construction applications (e.g., home or building construction, etc.). In other embodiments, panel 212 is configured for use in applications where an insulated barrier is desired in order to maintain a temperature differential (e.g., refrigeration applications, etc.). Generally, panel 212 is a flat member having opposite sides 226 and outer rim or edge 228. In some embodiments, panel 212 is a curved member having opposite sides 226 and outer rim or edge 228, e.g., for use within a curved wall portion. Panel 212 can be any suitable size or shape. For example, panel 212 is in some embodiments sized to fit between typical wall studs in home construction.

Figure 13:
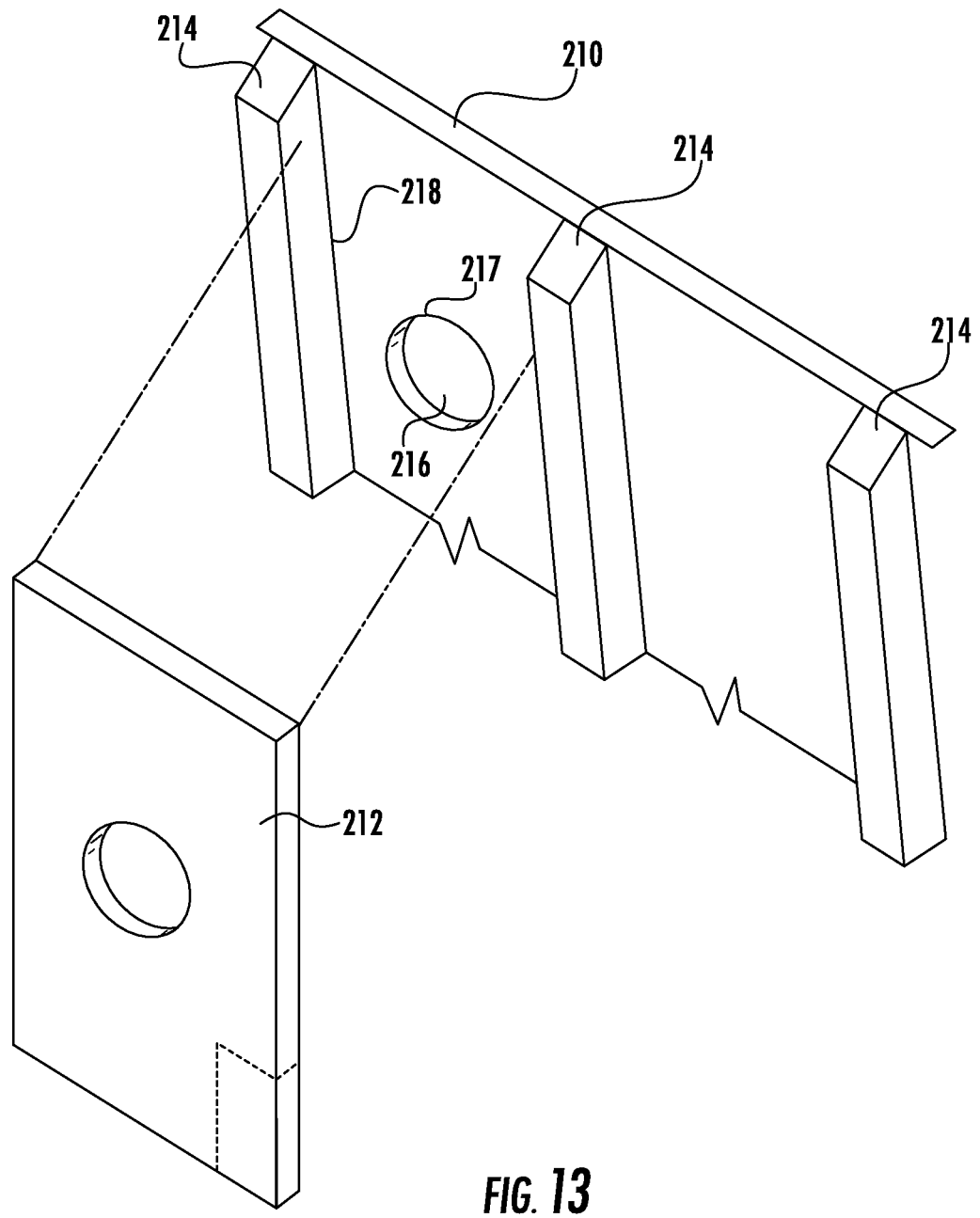
FIG. 13 is a perspective view of a wall to which an insulation member is to be applied according to one embodiment.
Figure 14:
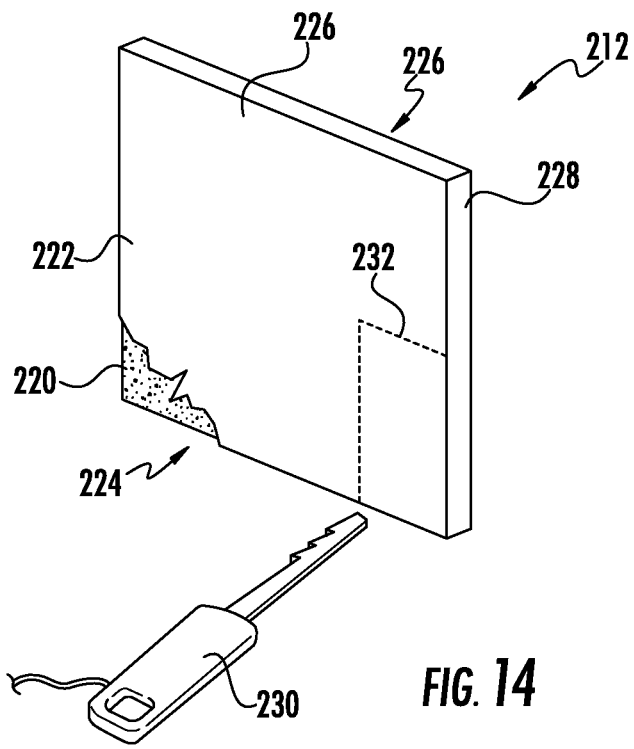
FIG. 14 is a perspective view of an insulation member according to one embodiment.
Figure 15:
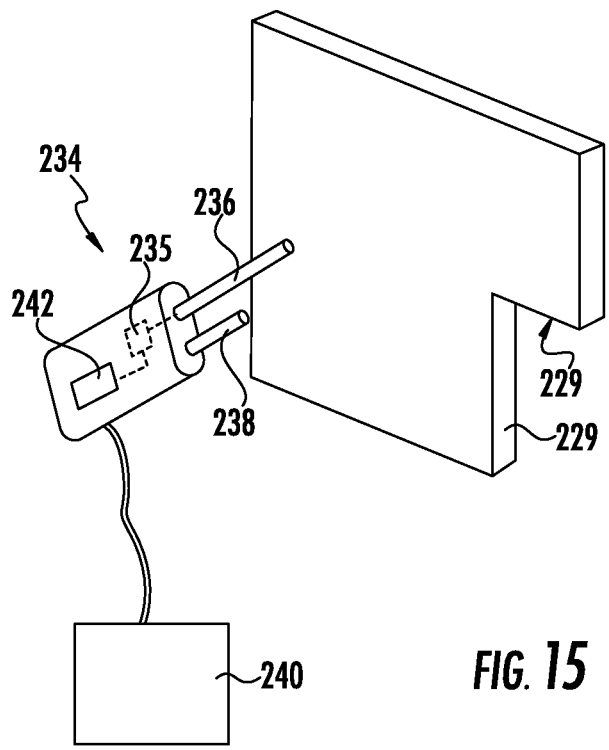
FIG. 15 is a perspective view of depressurization and sealing device working on an insulation member according to one embodiment.

Referring to FIGS. 13-15, panel 212 is in one embodiment configured to fit into wall portion 210 between studs 214. Wall portion 210 includes support members 214 (e.g., wall studs, etc.) defining spaces to receive panels 212. Wall portion 210 may further define boundaries 217, 218 and one or more obstructions 216 (e.g., holes, pipes, ducting, conduit, etc.). As such, panel 212 may be sized and/or trimmed to accommodate any such obstacles and boundaries using layout system 10 or a similar system.

Referring to FIG. 14, in one embodiment, panel 212 is trimmed on-site using cutting device 230 (e.g., a saw, trimmer, grinder, etc.). As shown in FIG. 14, panel 212 is cut or trimmed along trim line 232. Panel 212 is in some embodiments a panel that is removed from an existing structure and requires modification to accommodate one or more obstacles, boundaries, etc. In other embodiments, panel 212 is received from a panel supplier or other third party for installation into a structure, and cut line 232 is provided for cutting panel 212 prior to installation. Cut line 232 may denote a conduit penetration site. Cut line 232 is in some embodiments determined by layout system 10 in a fashion described above. Alternatively, panel 212 can be precut, or a cutting template can be provided (rather than a cut line).

Referring to FIG. 15, after trimming the appropriate portions of panel 212, panel 212 is resealed. In one embodiment, panel 212 is resealed prior to installation of the panel. In other embodiments, panel 212 is resealed in place. Resealing panel 212 enables a vacuum environment to be reestablished within the interior of panel 212. As shown in FIG. 15, sealing member 229 may be used to reseal panel 212 after trimming Sealing member 229 is in some embodiments provided in sheet or strip form and trimmable to accommodate different areas to be sealed.

Referring further to FIG. 15, once panel 212 is resealed, a vacuum environment is generated within interior 224 of panel 212 by depressurizing interior 224. As shown in FIG. 15, depressurization device 234 is used to penetrate panel 212 and reduce the pressure within interior 224. In one embodiment, device 234 includes conduit 236 coupled to vacuum pump 240. Conduit 236 is used to pierce film 222 of panel 212 and is in fluid communication with vacuum pump 240. Pump 240 operates to reduce the pressure within interior 224 to a desired pressure (e.g., a vacuum environment). In an embodiment, pump 240 operates to reduce the pressure to less than 1 bar gas pressure. In one embodiment, panel 212 is separately penetrated (e.g., with a pointed tool) before conduit 236 is attached (e.g., by inserting the conduit into the penetration site, by covering the penetration site with an aperture of the conduit, etc.). In some embodiments, devices 230 and/or 234 are integrated into a tooling system such as those described herein. Further, in some embodiments, the tooling system is configured to enclose individual insulation members with a fluid-tight outer cover.

After the vacuum environment is established within panel 212, panel 212 is resealed at the point of entry of device 234. In one embodiment, device 234 includes sealing mechanism 238 configured to apply an adhesive or other sealing material to panel 212. In other embodiments, device 234 is configured to inject an adhesive or sealant into interior 224 such that panel 212 seals as conduit 236 is removed. Sealing mechanism 238 may take any suitable size or shape according to various alternative embodiments, and the features of sealing mechanism 238 may be integrated into or separate from device 234 (e.g., in some embodiments sealing mechanism 238 is provided as part of a separate device). After panel 212 is resealed, panel 212 may be installed (or in the case of a modification of an existing structure, reinstalled) within a desired structure.

In certain embodiments, it is desirable to determine the pressure within panel 212, for example, while installed, to determine whether additional depressurization is required (e.g., in the case of leaks, insufficient initial depressurization, etc.). As such, device 234 is in some embodiments further configured to determine the pressure within panel 212. Conduit 236 is in fluid communication with interior 224, and as such, device 234 is able to determine a current pressure within interior 224 by way of pressure sensor module 235. Module 235 may be or include any suitable pressure sensor and computing electronics, and may be located in any suitable position.

In one embodiment, module 235 is coupled to input/output device 242. Input/output device 242 is configured to provide an output indicating a current pressure of interior 224 based on data received from pressure sensor module 235. In one embodiment, device 234 is configured to automatically actuate vacuum pump 240 to reduce the pressure within interior 224 when the pressure within interior 224 is sensed by pressure sensor module 235 to be above a threshold pressure level. In some embodiments, the threshold pressure is user-configurable via a user input. In other embodiments, vacuum pump 240 is actuated to reduce the pressure within interior 224 based on a user input (e.g., such that a user may decide whether to actuate pump 240). The input may be received via input/output device 242. After the current pressure is measured (and optionally vacuum pump 240 has sufficiently reduced pressure within interior 224), conduit 236 is removed from panel 212. As discussed above, sealant mechanism 238 can be used to reseal panel 212 at the point of entry of conduit 236.

Figure 16:
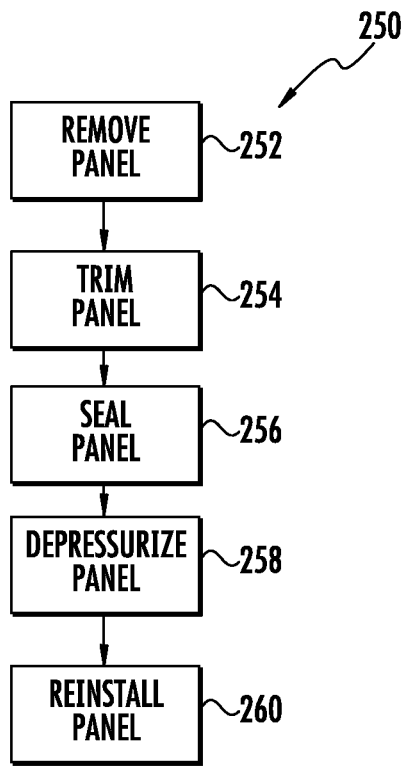
FIG. 16 is a block diagram illustrating a method of preparing and installing insulation members according to one embodiment.

Referring now to FIG. 16, method 250 of modifying a covering member such as panel 212 is shown according to one embodiment. The panel is removed (252). In some embodiments, the panel is removed from an existing structure such as a wall, etc. The panel is appropriately trimmed to accommodate one or more obstacles, boundaries, etc. (254). In one embodiment, panel 212 is trimmed based on layout data generated by a layout system such as layout system 10. For example, after removing the panel, one or more images (e.g., digital photographs, etc.) may be obtained of the area from which the panel was removed. The images may then be processed by a layout system to generate appropriate cut lines, cutting templates, etc. The panel is resealed (256). Resealing the panel is in some embodiments performed prior to reinstalling the panel, while in other embodiments, resealing the panel is performed after reinstalling the panel. The panel may be sealed using any suitable means, such as sealing member 229 (see FIG. 15), adhesives, spray-on sealants, films, etc. Once the panel is resealed, the panel is depressurized (258). The panel may be depressurized using a vacuum pump connected to a conduit that penetrates the panel. Once an appropriate vacuum environment is generated, the panel is resealed and reinstalled (260). As noted above, in some embodiments the panel may be reinstalled prior to resealing and depressurizing.

Figure 17:
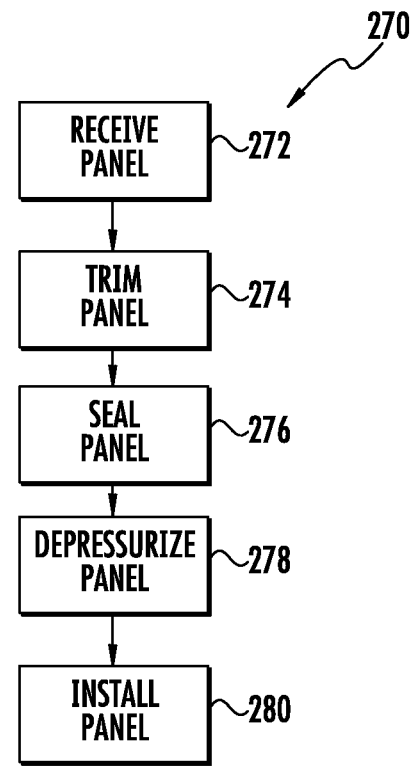
FIG. 17 is a block diagram illustrating a method of preparing and installing insulation members according to another embodiment.

Referring to FIG. 17, method 270 of installing a covering member such as panel 212 is shown according to one embodiment. The panel is received (272). In some embodiments, the panel is received from a panel vendor or other third party, etc. The panel is appropriately trimmed to accommodate one or more obstacles, boundaries, etc. (274). In one embodiment, panel 212 is trimmed based on layout data generated by a layout system such as layout system 10. The panel is resealed (276). Resealing the panel is in some embodiments performed prior to reinstalling the panel, while in other embodiments, resealing the panel is performed after reinstalling the panel. The panel may be sealed using any suitable means, such as sealing member 229 (see FIG. 15), etc. Once the panel is resealed, the panel is depressurized (278). The panel may be depressurized by using a vacuum pump connected to a conduit that penetrates the panel. Once an appropriate vacuum environment is generated, the panel is resealed and installed (280). As noted above, in some embodiments the panel may be installed prior to resealing and depressurizing.

Figure 18:
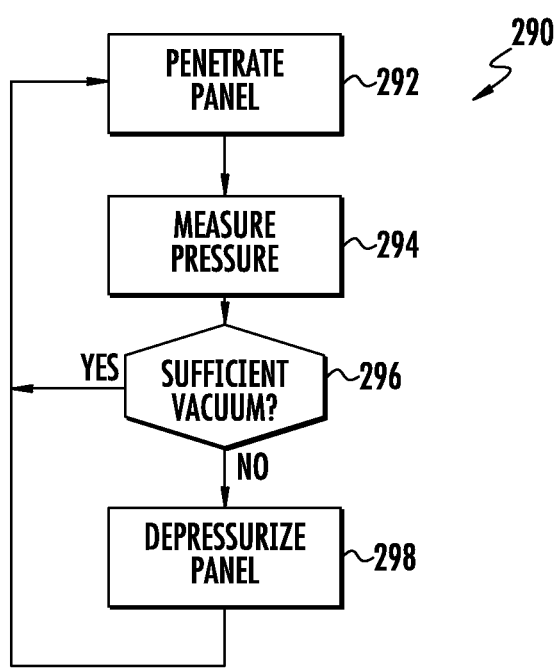
FIG. 18 is a block diagram illustrating a method of evaluating and depressurizing insulation members according to one embodiment.

Referring to FIG. 18, method 290 of evaluating and depressurizing covering members such as panel 212 is shown according to one embodiment. Method 290 is usable regardless of whether one or more panels is installed, uninstalled, or whether any modifications to the panel are needed due to various obstacles, boundaries, etc. The panel is penetrated (292). In one embodiment, the panel is penetrated such that a conduit provides fluid communication between the interior of the panel and a pressure sensor module configured to determine a pressure within the panel. The pressure is measured (294). Any suitable pressure sensor module or device may be used to measure the pressure within the interior of the panel. A determination is made as to whether the measured vacuum is sufficient (296). A threshold pressure may be used such that pressures at or below the threshold pressure are considered sufficient, and pressures above the threshold pressure are considered insufficient. If the vacuum is insufficient, the panel is depressurized (298). As noted above, in some embodiments, the evaluation of pressure levels and appropriate depressurization can be performed automatically by a device such as device 234 based on preset pressure thresholds. In other embodiments, a device such as device 234 is configured to display an internal pressure of a panel, such that a user manually actuates a depressurization device as appropriate. If the vacuum is sufficient, no further depressurization is required. The panel is resealed at the penetration side. One or more steps may be repeated for additional/subsequent panels.

Panels such as panel 212 may be provided and/or modified for installation in a variety of ways. For example, in some embodiments, panels are prepared using a layout system such as system 10 and according to a method such as that shown in FIG. 12, where cutting lines are determined based on various obstacles, boundaries, etc. The panels may come precut and depressurized with a vacuum interior, or alternatively, cutting patterns, templates, etc. may be provided to a user for on-site modification of panels, either as part of a new installation or a modification of an existing structure.

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of providing layout data for insulation members, comprising:
   receiving, from an image capture device, image data regarding one or more images associated with an area to receive the insulation members;
   determining dimensional data of the area based on the one or more images by at least one of the image capture device or a processing circuit of a layout device;
   receiving, by the layout device, a user input, the user input including a size of an insulation member;
   generating, by the layout device, layout data based on the dimensional data and the user input, the layout data providing an indication of at least one of a layout pattern or a cutting pattern of the insulation members for installation of the insulation members in the area, wherein the at least one of the layout pattern or the cutting pattern is based on minimizing a number of insulation members used for the area; and
   transmitting, by the layout device, the layout data to a tool system which will be used for printing a cut line on an individual insulation member of the insulation members.

2. The method of claim 1, wherein the image data includes one or more still images.

3. The method of claim 1, wherein the image capture device includes a camera.

4. The method of claim 1, wherein the tool system includes a printing device.

5. The method of claim 4, wherein the printing device is configured to print the cut line.

6. The method of claim 5, wherein the cut line denotes a conduit penetration site.

7. The method of claim 1, wherein the user input further identifies an internal gas pressure of the insulation members.

8. The method of claim 1, wherein the insulation members are vacuum-insulated panels.

9. The method of claim 1, wherein determining specific dimensional data of the area based on the one or more images includes using at least one of a boundary detection algorithm, a ridge detection method, a reference marker placed in a field of view of the image capture device, metadata associated with the one or more images, or a known dimension of the area received as a user input.

* * * * *